(12) United States Patent
Casiraghi et al.

(10) Patent No.: US 9,689,889 B1
(45) Date of Patent: Jun. 27, 2017

(54) SYSTEMS AND METHODS TO STABILIZE HIGH-Q MEMS SENSORS

(71) Applicant: Hanking Electronics, Ltd., Canton, OH (US)

(72) Inventors: Roberto Casiraghi, Milan (IT); Igino Padovani, Novate Milanese (IT); Giorgio Massimiliano Membretti, Milan (IT); Filippo David, Milan (IT)

( * ) Notice: Subject to any disclaimer, the term of this patent is extended or adjusted under 35 U.S.C. 154(b) by 388 days.

(21) Appl. No.: 14/067,105

(22) Filed: Oct. 30, 2013

Related U.S. Application Data

(60) Provisional application No. 61/857,996, filed on Jul. 24, 2013.

(51) Int. Cl.
| | | |
|---|---|---|
| G01R 27/08 | (2006.01) | |
| G01P 15/13 | (2006.01) | |
| B81B 7/02 | (2006.01) | |

(52) U.S. Cl.
CPC ............ G01P 15/131 (2013.01); B81B 7/02 (2013.01)

(58) Field of Classification Search
CPC ...... G01R 27/2605; G01R 27/02; G01R 1/44; G01R 31/028; G01P 15/165; G01P 15/16
USPC .................................................. 324/182, 682
See application file for complete search history.

(56) References Cited

U.S. PATENT DOCUMENTS

| | | | | |
|---|---|---|---|---|
| 5,612,494 A * | 3/1997 | Shibano | ................ | G01P 15/125 73/514.18 |
| 6,127,767 A * | 10/2000 | Lee | ..................... | G01C 19/5726 310/309 |
| 7,817,075 B2 * | 10/2010 | Lu | .......................... | H03M 3/454 324/658 |
| 8,421,481 B2 * | 4/2013 | Kumar | ................ | B81C 99/0045 324/649 |
| 8,661,871 B2 * | 3/2014 | Tripoli | .................... | G01C 19/56 333/186 |
| 2005/0024145 A1 * | 2/2005 | Bocock | ................. | H03F 1/0211 330/285 |
| 2005/0272397 A1 * | 12/2005 | Sowlati | ................ | H03D 7/1425 455/326 |
| 2006/0162454 A1 * | 7/2006 | Manninen | ............ | G01P 15/125 73/514.32 |
| 2007/0024951 A1 * | 2/2007 | Mochizuki | ......... | G02B 26/0841 359/291 |
| 2009/0161890 A1 * | 6/2009 | Lin | ......................... | H03F 3/187 381/113 |
| 2011/0115498 A1 * | 5/2011 | Kumar | ................ | B81C 99/0045 324/649 |
| 2012/0090393 A1 * | 4/2012 | Montanya Silvestre | ................. | G01P 15/00 73/514.18 |
| 2012/0235726 A1 * | 9/2012 | Elsayed | ............. | G01C 19/5776 327/299 |

(Continued)

*Primary Examiner* — Tung X Nguyen
*Assistant Examiner* — Dominic Hawkins
(74) *Attorney, Agent, or Firm* — Hartman Global IP Law; Gary M. Hartman; Domenica N. S. Hartman

(57) ABSTRACT

Various embodiments of the invention allow to reduce unwanted high-Q oscillations in capacitive MEMS sensors. In certain embodiments, stabilization of high-Q MEMS sensors is accomplished through a dedicated ultra-low power circuit that provides a bias voltage to one or more sensor electrodes during an OFF-phase. The bias voltage forces a balance condition that eliminates perturbations and enables smooth transitions that, ultimately, result in shorter sensor settling times.

5 Claims, 6 Drawing Sheets

(56) References Cited

U.S. PATENT DOCUMENTS

| | | | |
|---|---|---|---|
| 2012/0262192 A1* | 10/2012 | Zeleznik | H01H 59/0009 324/679 |
| 2013/0265070 A1* | 10/2013 | Kleks | G01R 27/2605 324/750.3 |
| 2014/0167789 A1* | 6/2014 | Cagdaser | G01R 27/2605 324/683 |
| 2014/0266260 A1* | 9/2014 | Wurzinger | G01R 27/2605 324/684 |
| 2014/0345380 A1* | 11/2014 | Jia | B81B 3/0016 73/514.32 |
| 2014/0361844 A1* | 12/2014 | Quevy | H03B 5/30 331/70 |

\* cited by examiner

SYSTEMS AND METHODS TO STABILIZE HIGH-Q MEMS SENSORS

CROSS REFERENCE TO RELATED PATENT APPLICATIONS

The present application claims priority to U.S. Provisional Application No. 61/857,996, titled "Systems and Methods to Stabilize High-Q MEMS Sensors," filed Jul. 24, 2013, by Roberto Casiraghi, Igino Padovani, Giorgio Massimiliano Membretti, and Filippo David, which application is hereby incorporated herein by reference in its entirety.

BACKGROUND

A. Technical Field

The present invention relates to high-Q Micro Electro Mechanical System (MEMS) sensors and, more particularly, to systems, devices, and methods of reducing resonance effects in high-Q MEMS sensors operating in spot mode.

B. Background of the Invention

A new generation of high performance, low power MEMS sensors is playing an increasingly important role in the consumer electronics market. Miniaturization efforts drive the integration of multiple navigational sensors, such as accelerometers, magnetometers, and gyroscopes, into a single package. Some inertial sensor applications that use stand-alone accelerometers in inclinometers, fall detection sensors, etc., employ spot mode operation techniques in order to reduce power consumption. Transitions between ON and OFF states within spot mode operation involve relatively rapid changes in sensor bias conditions that give rise to perturbations, which may cause unwanted oscillations that negatively impact settling times. In accelerometers sensor with movable proof-mass perturbations are greatly amplified when excitation frequencies coincide with resonance frequencies of high-Q mechanical resonator systems that comprise a proof-mass.

For these stand-alone accelerometers, existing solutions include utilizing atmospheric pressure inside the sensor cavity, which increases friction and lowers the quality factor of the mechanical resonator system so as to avoid oscillations or, at least, sufficiently reduce unwanted oscillations in order to achieve faster setting times.

Unfortunately, for MEMS gyroscope sensors, high Q is a crucial and wanted design parameter. In fact, these sensors are generally assembled and operated under vacuum conditions. Therefore, in an integrated accelerometer-gyroscope sensor system, as a tradeoff, the quality factor of a MEMS accelerometer sensor typically gives way to the requirements of the gyroscope since the quality factor of the MEMS accelerometer cannot be made sufficiently low so as to avoid unwanted high-Q oscillations during accelerometer spot mode operation.

What is needed are tools for system designers to overcome the above-described limitations.

SUMMARY OF THE INVENTION

The disclosed systems and methods allow to stabilize high-Q oscillations in capacitive MEMS sensors caused by perturbations resulting from turning ON-OFF transitions when biasing in the sensor readout chain in spot mode operation.

Various embodiments of the invention take advantage of a dedicated ultra-low power circuit module that provides an alternative bias to the sensor during an OFF-phase. The alternative bias is designed to apply to a sensor movable mass an electrostatic force that is comparable to a force that is present during an ON-phase. This minimizes perturbations of the sensor movable mass and, thus, provides for smooth transition conditions. As a result, relatively short sensor settling times can be achieved.

Certain embodiments of the invention also allow to reduce power consumption during spot mode operation in MEMS accelerometer systems. Certain features and advantages of the present invention have been generally described here; however, additional features, advantages, and embodiments presented herein will be apparent to one of ordinary skill in the art in view of the drawings, specification, and claims hereof. Accordingly, it should be understood that the scope of the invention is not limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that this is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention.

Figures 1A, 1B:
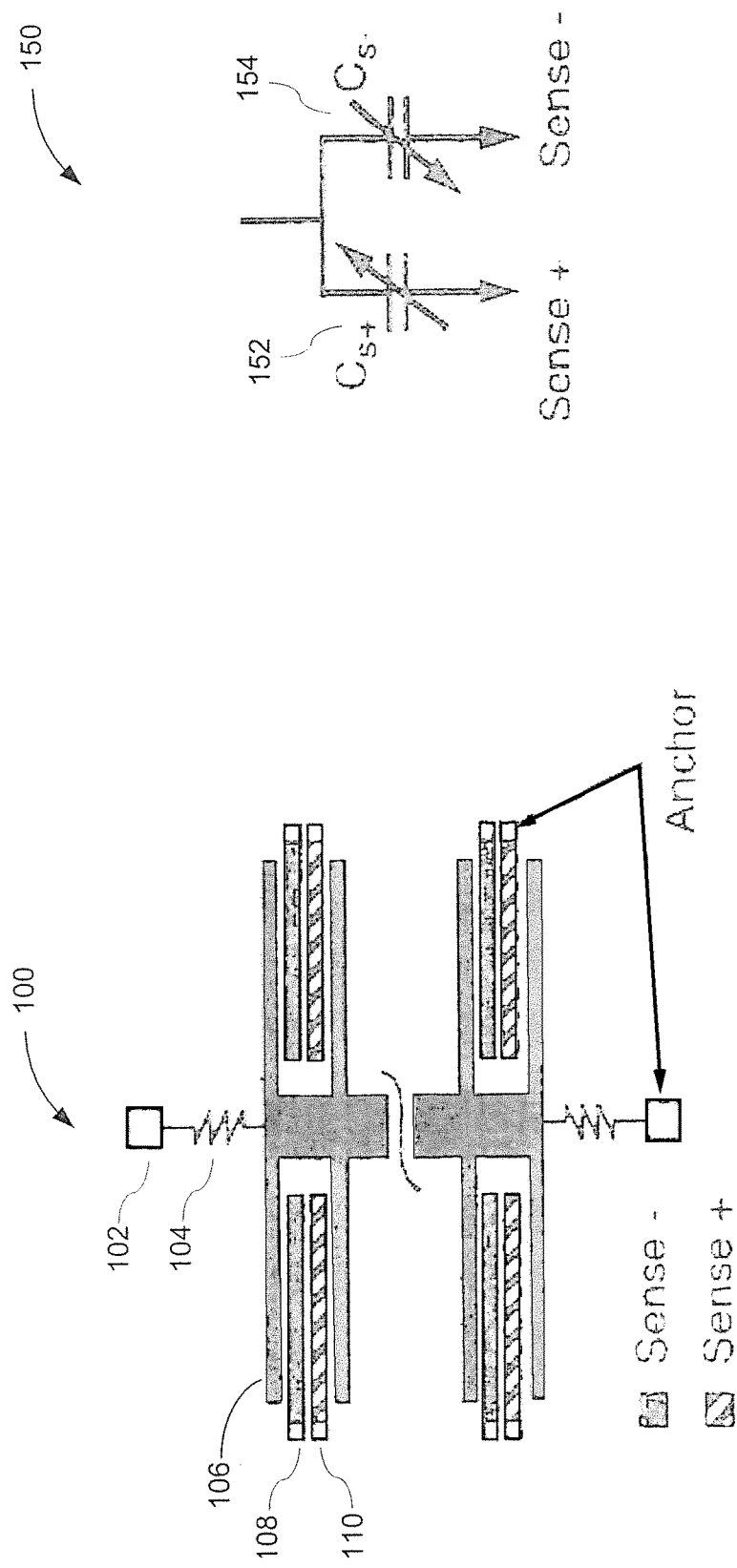
FIG. 1A shows a typical inertial MEMS accelerometer sensor for differential readout.
FIG. 1B shows a general electrical equivalent circuit representation of the MEMS sensor shown in FIG. 1A.

FIG. 1A shows a typical inertial MEMS accelerometer sensor 100 for differential readout. Sensor 100 is a relatively small mechanical device for use in various applications, including navigation. Sensor 100 comprises inertial proof-mass 106 that is anchored to a fixed structure 102 via spring 104. Sense electrodes 108, 110 are capacitive structures within sensor 100 that are driven by some electrical circuit (not shown).

FIG. 1B shows a general electrical equivalent circuit representation 150 of the MEMS sensor shown in FIG. 1A. Equivalent circuit 150 is formed by a pair of parallel variable capacitors 152, 154 that are typically coupled between a movable proof-mass having an inertial resistance to acceleration and a sensing circuit (not shown). The variation of the differential capacitance of capacitors 152, 154 is related to the movement of the proof-mass.

Figure 2A:
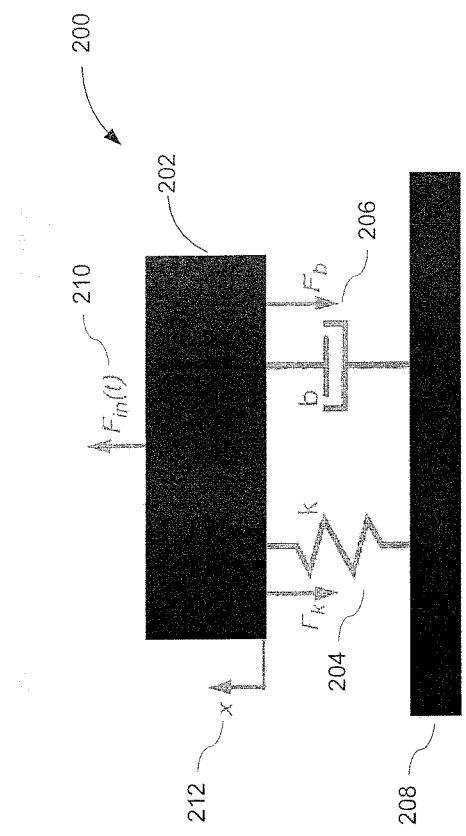
FIG. 2A shows a general mechanical model representing MEMS sensor in FIG. 1A.

FIG. 2A shows a general mechanical model representing MEMS sensor in FIG. 1A. Sensor 200 is an inertial MEMS accelerometer sensor. The mechanical model represents a harmonic resonator having a natural resonant frequency. The resonator comprises proof-mass 202, spring 204, and damping element 206. As shown in FIG. 2A, proof-mass 202 is connected to a parallel configuration of spring 204 and damping element 206. The parallel configuration is anchored to substrate 208. Proof-mass 202 is characterized by mass m, spring 204 is characterized by spring constant k, and damping element 206 is characterized by damping coefficient b. The resonant frequency of the mechanical system together with the bandwidth of the resonator define the quality factor, Q, of the resonant system, which is a dimensionless figure of merit.

Generally, the excitation frequency of an accelerometer sensor is significantly different from the mechanical resonant frequency of the accelerometer, such that acceleration of the sensor can be determined from the displacement 212 of proof-mass 202 relative to substrate 208.

Displacement 212 (labeled as "x") is characterized by a movement in position, x, of proof-mass 202 resulting from inertial acceleration force Fin(t) 210 acting on proof-mass 202. Displacement 212 can be capacitively measured and converted into a measured acceleration value. In addition to gravity, the sum of acceleration force 210, spring force $F_k$, and damping force $F_b$ determine the total time-varying force F(t) that acts on proof-mass 208. Displacement 212 of proof-mass 202 is related to the force F(t) in the mechanical model of sensor 200 through the following second order differential equation $$F(t)=m\ddot{x}+b\dot{x}+kx$$

which can be solved by numerical analysis.

Figure 2B:
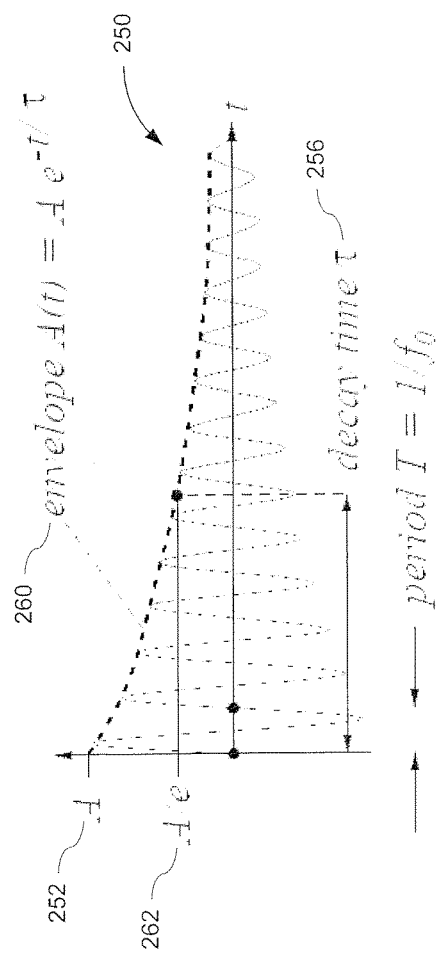
FIG. 2B shows a typical step response for the general mechanical model in FIG. 2A.

FIG. 2B shows a typical step response 250 for the general mechanical model in FIG. 2A. FIG. 2B depicts an exponentially decaying mechanical oscillation having envelope 260. The oscillation decays from its initial amplitude A 252 to value A/e 262 within decay time τ 256. The quality factor, Q, of this harmonic resonator is a parameter that can be determined from the decay. In particular, Q can be determined from the number of oscillations within a decay time τ 256 within which amplitude A 252 decays by approximately 37%. The quality factor can be, thus, be expressed by equation $$Q=\pi(\tau/T)$$

where T is the period of the resonance oscillation measured in seconds.

From this equation it can be deduced that a higher Q factor results in longer settling times for the proof-mass to reach a stable position. The time constants involved in the decay following a mechanical disturbance are typically one or more orders of magnitude greater than typical electrical time constants.

Figure 3A:
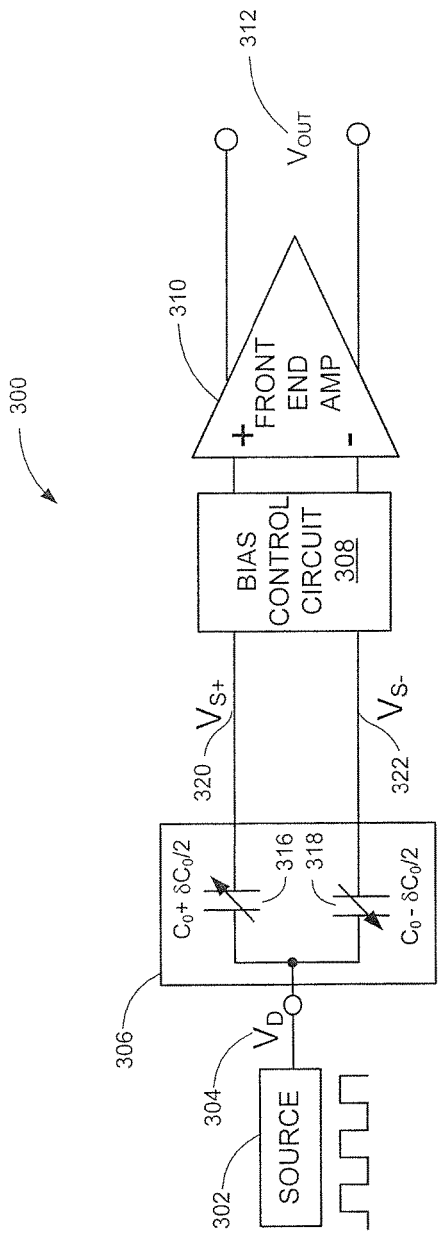
FIG. 3A shows a block diagram of a prior art MEMS sensor front end readout circuit.

FIG. 3A shows a block diagram of a prior art MEMS sensor front end readout circuit 300. Readout circuit 300 comprises voltage source 302, sensor 306, bias control circuit 308, and front end amplifier 310. Voltage source 302 is coupled to MEMS sensor 306 that outputs differential sensor output signal 320, 322 to low-noise front end amplifier 310 via bias control circuit 308. MEMS sensor 306 is an accelerometer sensor configured to read out the position of a proof-mass within the MEMS sensor 306 and sensor output signal 320, 322.

In operation, voltage source 302 provides a source voltage 304 as a stimulus to electrodes of sensor 306 to determine variations in the capacitance of sensor electrodes 316, 318. MEMS sensor 306 generates differential sensor output signal 320, 322 in response to receiving acceleration information from sensor electrodes 316, 318. Bias control circuit 308 controls capacitive sensor outputs common mode voltage by applying to it an average bias voltage that creates an average electrostatic force on capacitive electrodes 316, 318 in order to properly read out differential sensor output signal 320, 322. Signal 324 is provided to front end amplifier 310. Front end amplifier 310 amplifies signal 324 to generate output signal $V_{OUT}$ 312.

Once sensor electrodes 316, 318 are biased, electrostatic forces due to the charge on the plates of capacitive electrodes 316, 318 add to the total force F(t) applied to the proof-mass. The net electrostatic force $F_{el}$ can be expressed by equation $$F_{EL}=a_x(V_{S+}-V_D)^2-a_{-x}(V_{S-}-V_D)^2$$

where $V_{S+}$ and $V_{S-}$ are bias voltages; and $V_D$ is the source voltage 304, and coefficients $a_x$ and $a_{-x}$ are proportionality factors that depend on the particular geometry of sensor 306 (e.g., the gap between proof-mass and sensor electrodes 316, 318).

Ideally, the sum of the electrostatic forces applied to sensor electrodes 316, 318 are balanced, such that the net electrostatic force of the mechanical system cancels out. As a result, the application of the bias voltage to sensor electrodes 316, 318 will not cause any additional forces on the proof mass that possibly create perturbations and negatively impact readout voltage 312. However, due to imbalance of coefficients $a_x$ and $a_{-x}$, a change in one or of more of voltages $V_{S+}$, $V_{S-}$, or $V_D$ at the MEMS electrodes, tends to disturb the force balance and cause the proof-mass to oscillate, until the system reaches a stable position (within boundaries defining a predetermined displacement accuracy after the passage of a corresponding settling time).

In contrast, during a non-reading phase of the spot mode operation, a zero bias voltage may be applied to sensor electrodes 316, 318 or to output of voltage source 302 in order to conserve energy.

Figure 3B:
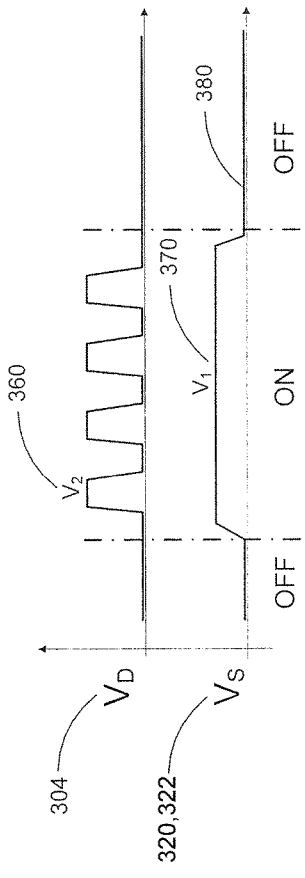
FIG. 3B shows typical voltage waveforms during spot mode operation of a prior art MEMS sensor front end readout circuit.

FIG. 3B shows typical voltage waveforms during spot mode operation of a prior art MEMS sensor front end readout circuit 300. In spot mode, which involves relatively low output data rates (e.g., 10 Hz-50 Hz), the system alternates between an ON phase and an OFF phase. Only during the ON phase (e.g., 1 ms) is acceleration information processed by active front-end circuit 300. During this phase, bias control circuit 308 applies a bias voltage to differential sensor electrodes 316, 318 to generate biased sense signal $V_1$ 370, while during the relatively longer OFF phase (e.g., 100 ms) power hungry circuit components, such as front end amplifier 310, are powered down and capacitive sensor electrodes 316, 318 are grounded, so the sense signal $V_S$ 354 assumes a zero value.

In practice, mainly due to mechanical sensor non-idealities (e.g., mass imbalance), it is difficult to achieve the desired zero electrostatic force condition in both ON and OFF phases. As previously noted, transitions between ON and OFF phases involve a relatively rapid change in sensor bias conditions that may cause a perturbation of the proof-mass within the sensor that moves the proof-mass with some amplitude of displacement.

In this example, biased sense signal $V_1$ 370 in the ON phase causes an electrostatic force on sensor 306 that is much different from the non-biased OFF phase. As a result, the application of a bias voltage by bias control circuit 308 causes an undesired and abrupt stimulus that perturbs the proof-mass within sensor 306 and creates unwanted oscillations that can last for a few milliseconds or more prior to decaying to an acceptable target range. The amplitude of the oscillation is especially large if the transition occurs at excitation frequencies that coincide with the mechanical resonance frequency of the mechanical resonator system. Therefore, it would be desirable to minimize the oscillation amplitude and achieve a fast turn-on time of readout circuit 300 for a given accuracy.

Unfortunately, the change in electrostatic force cannot be simply treated as a DC signal that could be offset and compensated. Therefore, it will be apparent that any electrical frequencies contained in source voltage $V_D$ 304 should be chosen, such that they do not overlap with potential excitation frequencies of the harmonic system presented in FIG. 2A. For example, if the harmonic system has a resonance frequency in the Hz range, the source voltage $V_D$ 304 could be chosen to operate in the kHz range.

In some existing designs, in order to ensure accurate acceleration information, the duration of the ON phase is extended so as to accommodate the settling time in which the MEMS mechanical position undergoes the stabilization process prior to performing a reading operation. Extending the ON phase, however, increases power consumption and, especially in high-Q mechanical systems, negates to a certain degree the energy savings that are gained by operating sensor 306 in spot mode.

Figure 4A:
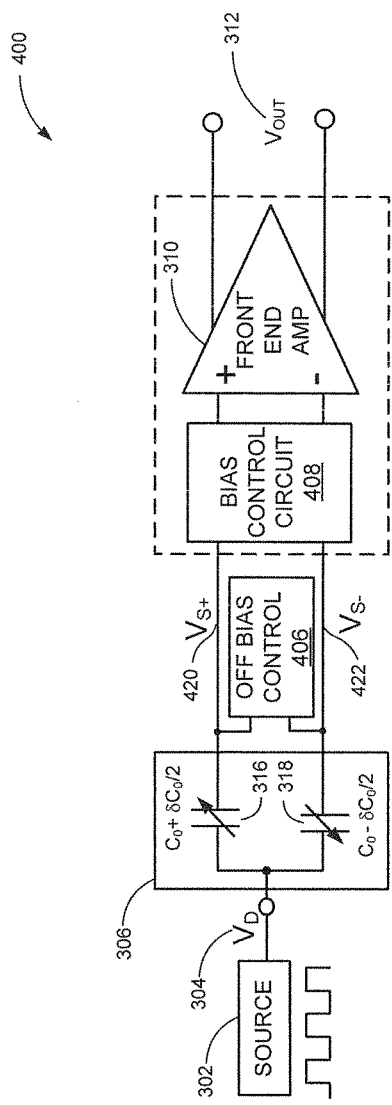
FIG. 4A illustrates an exemplary block diagram of a MEMS accelerometer front-end readout circuit utilizing a low power voltage bias control circuit, according to various embodiments of the invention.

FIG. 4A illustrates an exemplary block diagram of a MEMS accelerometer front-end readout circuit utilizing a low power voltage bias control circuit, according to various embodiments of the invention. For clarity, components similar to those shown in FIG. 3A are labeled in the same manner. Front-end circuit 400 comprises voltage source 302, sensor 306, off-bias control circuit 406, bias control circuit 408, and front end amplifier circuit 310. Voltage source 302 is coupled to sensor 306. Sensor 306 outputs differential sense signal 420, 422 to differential, low-noise front end amplifier 310 via bias control circuit 408.

In this example, MEMS sensor 306 is an inertial capacitive accelerometer sensor that, in response to reading out the position of a proof-mass, generates sense signal 420, 422. Front end amplifier circuit 310 is an analog front-end circuit coupled to MEMS sensor 306 to read sense signal 420, 422. Off-bias control circuit 406 is a low power control circuit that is coupled to sense signal 420, 422. Bias control 408 is a dedicated circuit that is configured to provide a bias voltage to sensor electrodes 316, 318. In one embodiment, bias control circuit 408 is an input common mode voltage circuit of front end amplifier 310.

In operation, voltage source 302 provides source voltage 304 as a stimulus to electrodes 316, 318, e.g., in the form of a pulsating input voltage signal, in order to determine variations in the capacitance of sensor electrodes 316, 318. Sensor 306 generates differential sense signal 420, 422 in response to reading out acceleration information from capacitive sensor electrodes 316, 318. During a reading phase of the spot mode operation, bias control circuit 408 controls sense signal 420, 422 by applying an average bias voltage to sensor electrodes 316, 318 in order to obtain acceleration information. The common mode voltage produces an average electrostatic force on the proof mass within sensor 306 and enables front-end circuit 400 to properly read out differential sense signal 420, 422. The bias-controlled sense signal 420, 422 is provided to front end amplifier 310, which amplifies and outputs it as output signal $V_{OUT}$ 312.

During a non-reading phase, unlike prior art MEMS sensor front end readout circuits that apply a zero bias voltage to sensor electrodes 316, 318 or to the output of voltage source 302, in one embodiment, only voltage node of source voltage 304 is grounded, while sense signal 420, 422 are biased through bias control circuit 406 to a voltage $V_{1\_OFF}$ to both sensor electrodes 316, 318.

The bias voltage $V_{1\_OFF}$ is designed to satisfy the following equation:

$$<(V_1-V_D)^2>=<(V_{1\_OFF})^2>$$

where $V_1$ is the common mode voltage set by bias-control to sense signal 420, 422, $V_D$ is the source voltage 304 in the ON phase, and $V_{1\_OFF}$ is the off-bias-controlled sense signal 420, 422. As a result, the average electrostatic forces in both ON phase and OFF phase, balance each other independent of mechanical sensor non-idealities. One of ordinary skill in the art will appreciate that any timing circuit known in the art may be used to implement the timing function of source voltage 304.

In one embodiment, $V_S$ is grounded in the OFF phase and $V_{1\_OFF}$, rather than being applied to $V_S$, is applied to source voltage 304 $V_D$ via a second voltage source (not shown). This is possible because the electrostatic force responds to the averaged square value of the voltage difference between sensed voltage $V_S$ 454 and source voltage 304 $V_D$, so that becomes irrelevant whether $V_{1\_OFF}$ is applied to voltage 454 $V_S$ or 304 $V_D$.

In one embodiment, off-bias control circuit 406 is implemented as a low power mode within bias-control circuit 408. In this embodiment, bias-control circuit 408 comprises a bit selection circuit that selectably operates in a regular power mode during the first phase when bias-controlled sense signal 420, 422 is biased with a first voltage $V_1$, and operates in the low power mode during the second phase when off-bias-controlled sense signal 420, 422 is biased with a second voltage $V_{1\_OFF}$. This embodiment eliminates the need for off-bias control circuit 406 and, thus, reduces the die area required by front-end circuit 400.

It is noted that the specifications for the two modes of operation of circuit 408 are different in that, for example, the first mode involves considerations of specific noise requirements of front-end amplifier 310, and bandwidth requirements of the modified bias-control circuit. In one embodiment, off-bias control circuit 406 can be implemented within front-end amplifier 310, by simply holding the ON state bias voltage $V_{1\_ON}$ value on one or more capacitors, e.g., on the sensor capacitors themselves, during the OFF-phase. In this embodiment, the difference between the voltage held on the capacitors and the calculated ideal $V_{1\_OFF}$ value may be compensated to account for leakage current of the sensor electrodes.

In one embodiment, the off-bias-controlled sense signal 420, 422, $V_{1\_OFF}$, is generated by a circuit that comprises trimming capability that is configured to match process variations or operational variables, such as power supply voltage, temperature variations, etc. of both $V_1$ and $V_2$.

Figure 4B:
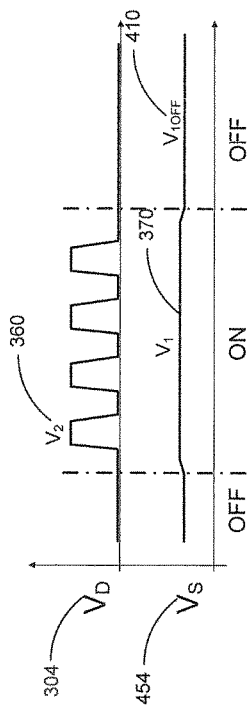
FIG. 4B illustrates exemplary voltage waveforms during spot mode operation of a MEMS accelerometer front-end readout circuit according to various embodiments of the invention.

FIG. 4B illustrates exemplary voltage waveforms during spot mode operation of a MEMS accelerometer front-end readout circuit according to various embodiments of the invention. Same numerals as in FIG. 3B denote similar elements. It is noted that FIG. 4B is not drawn to scale.

During a reading phase, ON state voltage waveforms 360, 370 are similar to voltage waveforms depicted in FIG. 3A. However, during a non-reading phase, off-bias voltage waveform $V_{1\_OFF}$ 410 of sensed voltage $V_S$ 454 is ideally identical to ON state bias voltage waveform $V_1$ 370. Off-bias voltage $V_{1\_OFF}$ 410 generates an electrostatic force comparable to the force that sensor electrodes 316, 318 experience during the ON state. In other words, equivalent bias conditions are present in both the reading phase and the non-reading phase. The resulting force balance allows proof-mass in sensor 306 to experience ideally no changes in electrostatic force and, thus, remain free from resonance effects during transitions between phases.

Any residual mismatch between electrostatic forces caused, for example, by minor voltage errors would still benefit from reduced oscillations that allow the resonant system to reach its settling target relatively faster than prior art designs with the additional benefit of the low power design that reduces energy consumption. It will be apparent to one of skill in the art that applying an off-bias voltage $V_{1\_OFF}$ advantageously eliminates from bias-control circuit 408 any noise constraints that are otherwise present in the ON state during the reading phase.

Figure 5:
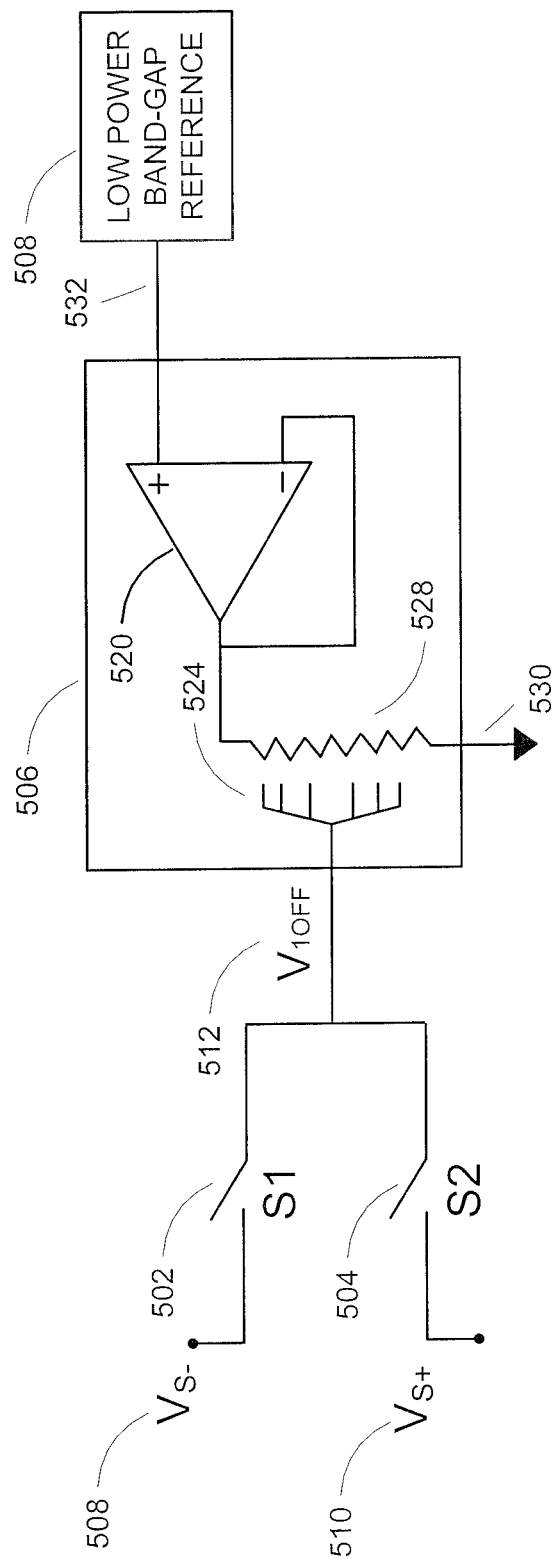
FIG. 5 illustrates an exemplary schematic of a low power voltage bias control circuit according to various embodiments of the invention.

FIG. 5 illustrates an exemplary schematic of a low power voltage bias control circuit 500 according to various embodiments of the invention. Circuit 500 comprises switch 502, 504, trim DAC 506, and low power band-gap reference module 508. In one embodiment, trim DAC 506 comprises operational amplifier 520 to buffer bandgap reference voltage 532 on resistive ladder 528. Resistive ladder 528 is coupled to the output $V_{1\_OFF}$ 512 via switches 524. It will be apparent to one of skill in the art that many different implementation of trim DAC 506 are possible. Trim DAC 506 may be factory pre-set, for example based on measurements of $V_1$ and $V_2$, to a predetermined value for $V_{1\_OFF}$ 512 that is within the resolution and the accuracy of trim DAC 506. Since the voltage error resulting from the difference between $V_{1\_OFF}$ 512 generated by trim DAC 506 and the calculated $V_{1\_OFF}$ may disturb the system, in one embodiment, the resolution of DAC 506 is increased in a range of expected $V_1$ values in order to keep tsensor resonance oscillation within a desired accuracy range.

In one embodiment, low power band-gap reference module 508 is realized by sampling the ON-state band-gap reference with a low power (e.g., passive) sample-and-hold circuit (not shown in FIG. 5). The sampled voltage may be refreshed at every ON-cycle. In this example, the trimming could be reduced or entirely avoided.

Figure 6:
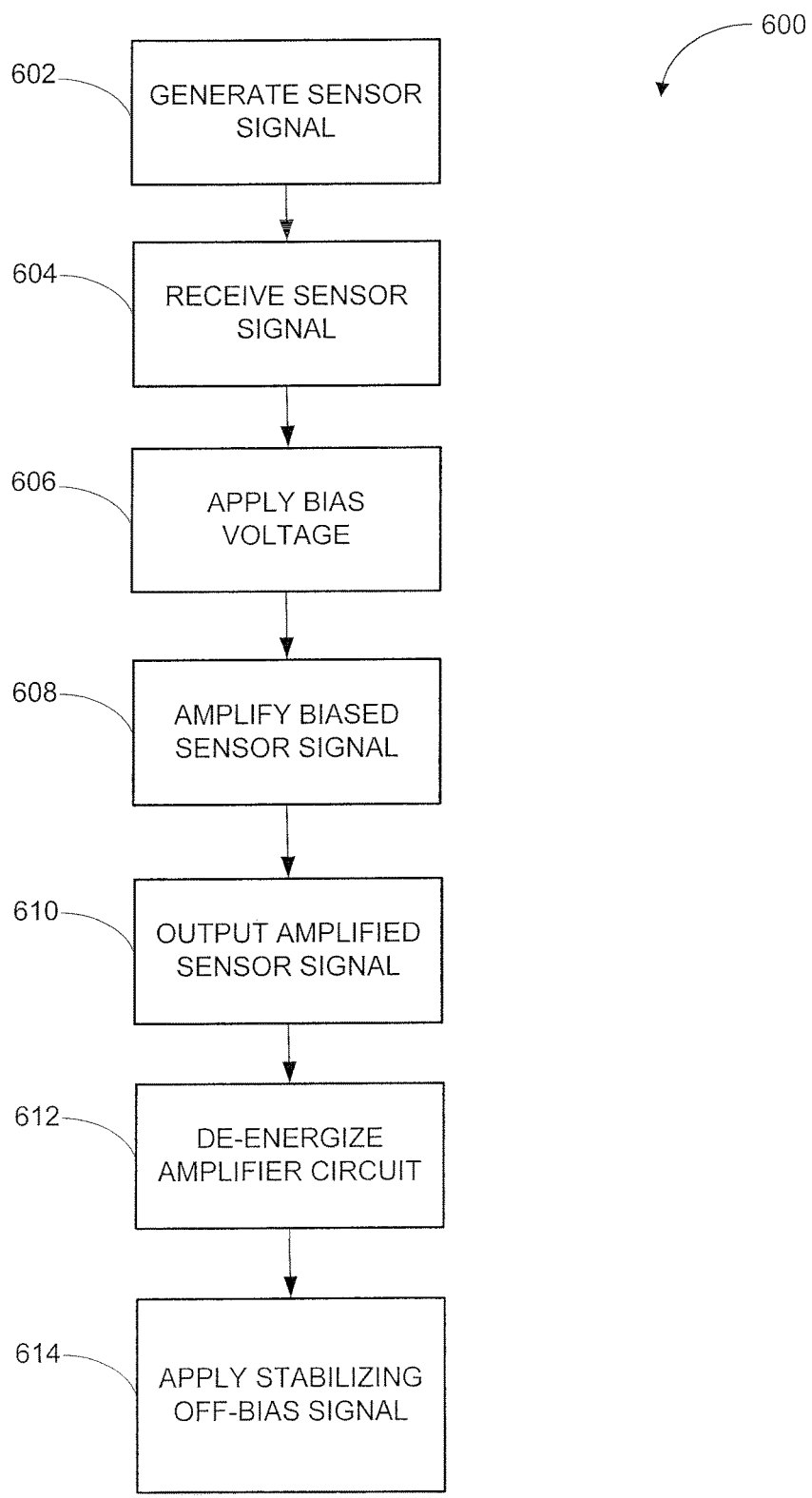
FIG. 6 is a flowchart of an illustrative process for stabilizing high-Q MEMS sensors in accordance with various embodiments of the invention.

FIG. 6 is a flowchart of an illustrative process for stabilizing high-Q MEMS sensors in accordance with various embodiments of the invention. The process for stabilizing 600 starts at step 602 when a sensor generates a sensor signal, for example, in response to receiving a pulsating input voltage.

At step 604 the sensor signal is received, for example, by a first bias control circuit that is coupled within a front-end readout circuit.

At step 606, a bias voltage is applied to the sensor, for example, by the front-end readout circuit to generate a biased sensor signal.

At step 608, the biased sensor signal is amplified by a front-end amplifier circuit to generate an amplified sensor signal.

At step 610, the amplified sensor signal is output from the front-end readout circuit.

At step 612, the front-end amplifier circuit is de-energized.

At step 614, an OFF bias control voltage is applied to the sensor signal.

In one embodiment, the process for stabilizing further comprises the steps of energizing a front-end amplifier. In one embodiment, the process for stabilizing further comprises energizing and de-energizing a bias control circuit.

It will be appreciated by those skilled in the art that fewer or additional steps may be incorporated with the steps illustrated herein without departing from the scope of the invention. No particular order is implied by the arrangement of blocks within the flowchart or the description herein.

It will be further appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

We claim:

1. A method to stabilize a high-Q MEMS sensor, the method comprising:
   receiving a sensor signal from a sensor:
   applying a bias voltage to the sensor:
   amplifying the biased sensor voltage using a front-end amplifier circuit:
   outputting the amplified and biased sensor signal from a front-end readout circuit:
   de-energizing the front-end amplifier circuit: and
   applying a bias control voltage to the sensor, wherein the bias control voltage causes an average electrostatic force applied to at least two sensor electrodes to be equal in a first phase and a second phase.

2. The method according to claim 1, wherein the sensor signal is generated in response to receiving a pulsating input voltage.

3. The method according to claim 1, wherein generating the sensor signal occurs in response to receiving data related to a position of a proof-mass.

4. The method according to claim 1, wherein the bias control voltage to the sensor is applies to a differential sensor output signal.

5. The method according to claim 1, wherein the bias control voltage is applied to the sensor via a voltage source.

* * * * *